United States Patent
Iwasaki et al.

(10) Patent No.: US 6,649,463 B2
(45) Date of Patent: Nov. 18, 2003

(54) REGULATING RESISTOR NETWORK, SEMICONDUCTOR DEVICE INCLUDING THE RESISTOR NETWORK, AND METHOD FOR FABRICATING THE DEVICE

(75) Inventors: Yukio Iwasaki, Osaka (JP); Hidetoshi Furukawa, Osaka (JP); Tsuyoshi Tanaka, Osaka (JP); Daisuke Ueda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/754,308

(22) Filed: Jan. 5, 2001

(65) Prior Publication Data

US 2001/0001493 A1 May 24, 2001

Related U.S. Application Data

(62) Division of application No. 09/432,107, filed on Nov. 2, 1999, now Pat. No. 6,201,288.

(30) Foreign Application Priority Data

Nov. 6, 1998 (JP) ............................................. 10-315873

(51) Int. Cl.[7] ............................................... H01L 21/20
(52) U.S. Cl. ...................... 438/238; 438/382; 438/384; 438/385; 438/690
(58) Field of Search ............................... 438/238, 381, 438/382, 384, 385, 690

(56) References Cited

U.S. PATENT DOCUMENTS

| | | | |
|---|---|---|---|
| 3,699,649 A | * 10/1972 | McWilliams | 29/610.1 |
| 3,758,745 A | 9/1973 | Wilker et al. | 219/121.68 |
| 4,570,115 A | * 2/1986 | Misawa et al. | 323/313 |
| 4,782,320 A | 11/1988 | Shier | |
| 4,841,275 A | 6/1989 | Murata | |
| 5,053,650 A | * 10/1991 | Ohkubo et al. | 327/566 |
| 5,206,623 A | 4/1993 | Rochette et al. | 338/203 |
| 5,243,319 A | 9/1993 | Brokaw | |
| 5,284,794 A | 2/1994 | Isobe et al. | |
| 5,530,270 A | * 6/1996 | Takahashi et al. | 257/154 |
| 6,326,256 B1 | * 12/2001 | Bailey et al. | 438/238 |

FOREIGN PATENT DOCUMENTS

| | | | |
|---|---|---|---|
| EP | 0 324 407 | 1/1989 | |
| JP | 04033288 | * 2/1992 | H05B/3/46 |
| JP | 06-310311 | 11/1994 | |
| JP | 09-331021 | 12/1997 | |

OTHER PUBLICATIONS

English Translation of JP 06–310311.*
Serway, "Resistors In Series and in Parallel", Physics for Scientist & Engineers with Modern Physics, Third Edition, Sanders College Publishing, 1986, pp. 767–770.*
European Search Report, Jan. 26, 2001, 3 pages.
Yamaguchi, Kazuyoshi, Development of LCR Laser Function Trimming Unit, Apr. 12, 1995, p. 283–286.

* cited by examiner

*Primary Examiner*—Stephen D. Meier
*Assistant Examiner*—Toniae M. Thomas
(74) *Attorney, Agent, or Firm*—Nixon Peabody LLP; Donald R. Studebaker

(57) ABSTRACT

A regulating resistor network includes a plurality of resistors connected in parallel to each other. Each of these resistors is cuttable by being irradiated with light, and a resistance value of the regulating resistor network is adjustable by cutting at least one of the resistors off.

6 Claims, 9 Drawing Sheets

REGULATING RESISTOR NETWORK, SEMICONDUCTOR DEVICE INCLUDING THE RESISTOR NETWORK, AND METHOD FOR FABRICATING THE DEVICE

This application is a divisional of application Ser. No. 09/432,107 filed Nov. 2, 1999 now U.S. Pat. No. 6,201,288.

BACKGROUND OF THE INVENTION

The present invention relates to a regulating resistor network for regulating voltage or current supplied to a semiconductor circuit within certain limits, a semiconductor device including such a resistor network and a method for fabricating the device.

Hereinafter, a semiconductor device including a conventional regulating (or trimming) resistor will be described with reference to FIGS. 10(a) and 10(b).

As shown in FIG. 10(a), first and second chips B and C are mounted on a printed wiring board A. A field effect transistor (FET) 1 is formed as an amplifier on the first chip B. The drain terminal of the FET 1 is connected to a drain voltage supply terminal 2, while the source terminal thereof is grounded.

A resistance adjustment circuit 4 for regulating a bias voltage applied to the gate terminal 3 of the FET 1 is formed on the second chip C. The resistance adjustment circuit 4 includes a voltage supply terminal $V_{GG}$, first and second voltage dividers 5 and 6 and a trimming resistor 7, which are connected in series to each other. In FIG. 10(a), a signal input terminal $V_S$ for applying an input voltage to the gate terminal 3 of the FET 1 is provided on the printed wiring board A.

As shown in FIG. 10(b), the trimming resistor 7 is implemented as a thin-film resistor including a plurality of notches 7a, which have been formed by laser-trimming the thin-film resistor. In such a thin-film resistor, the current path has an increased length. Thus, the resistance value of the thin-film resistor goes on increasing gradually as the current flows over a longer distance, and the resistance value of the trimming resistor 7 is adjustable.

Once the resistance value of the trimming resistor 7 has changed, the amount of a current flowing through the resistance adjustment circuit 4 also changes. As a result, the bias voltage applied to the gate terminal 3 of the FET 1 changes, too. Thus, even if the operating current of the FET 1 has deviated from a predetermined value, the operating current can be regulated at the desired value by adjusting the resistance value of the trimming resistor 7 and thereby changing the bias voltage applied to the gate terminal 3.

Hereinafter, a method of regulating the operating current of the FET 1 by adjusting the resistance value of the trimming resistor 7 will be briefly described.

First, a predetermined voltage is applied to the voltage supply terminal $V_{GG}$ of the resistance adjustment circuit 4 and a bias voltage is applied to the gate terminal 3 of the FET 1. In such a state, while the operating current of the FET 1 is being monitored, the thin-film trimming resistor 7 is laser-trimmed, thereby gradually increasing the resistance value of the trimming resistor 7.

Thereafter, when the operating current flowing through the FET 1 reaches a predetermined value, the laser trimming of the thin-film resistor is stopped, thereby fixing the current flowing through the resistance adjustment circuit 4 at a constant value.

As described above, to adjust the resistance values of the trimming resistor 7 and the resistance adjustment circuit 4, the thin-film trimming resistor 7 should be laser-trimmed, while the operating current of the FET 1 is being monitored. Thus, it usually takes as long a time as 5 to 7 seconds to complete such fine adjustment.

In addition, since the resistance value of the thin-film trimming resistor 7 should be adjusted by irradiating the trimming resistor 7 with laser beams for such a long time, the trimming resistor 7 and the resistance adjustment circuit 4 both receive a large quantity of heat. Accordingly, if the resistance adjustment circuit 4 and the FET 1 are formed on the same chip, then the laser irradiation on the trimming resistor 7 causes considerable damage to the FET 1.

Thus, in the conventional arrangement, a semiconductor circuit such as the FET 1 and the resistance adjustment circuit 4 should be separately formed on the first and second chips B and C. And then these chips B and C should be mounted on the printed wiring board A. That is to say, the semiconductor circuit and resistance adjustment circuit cannot be integrated on the same chip.

SUMMARY OF THE INVENTION

An object of the present invention is getting resistance adjustment circuit and semiconductor circuit integrated on the same chip by shortening the time taken to adjust the resistance value of the resistance adjustment circuit and by reducing the quantity of heat received by the resistance adjustment circuit during the adjustment.

A regulating resistor network according to the present invention includes a plurality of resistors connected in parallel to each other. Each said resistor is cuttable by being irradiated with light, and a resistance value of the regulating resistor network is adjustable by cutting at least one of the resistors off.

In the inventive regulating resistor network, each resistor is cuttable by being irradiated with light, and therefore, if at least one of the resistors is cut off, then the resistance value of the regulating resistor network is adjustable. Thus, the time taken to adjust the resistance value of the regulating resistor network can be shorter than the conventional one. That is to say, there is no longer any need to change the length of a current path in a thin-film resistor through notching as is done in the conventional trimming resistor. Instead, the resistance value is changeable only by cutting at least one of the resistors off according to the present invention. Thus, the time needed for adjusting the resistance value can be drastically cut down.

In one embodiment of the present invention, the resistors preferably have mutually different resistance values. In such an embodiment, a great number of resistance value combinations can be created by cutting off a variable number of resistors.

In this particular embodiment, the resistors are preferably of mutually different lengths. In such an embodiment, even if a size error occurred among the resistors formed by patterning a metal thin film, the resistance value of the regulating resistor network does not deviate from its desired value so much and is still finely adjustable.

In another embodiment of the present invention, the resistor network preferably further includes a fixed resistor, which is connected in parallel to the resistors and is not cuttable by being irradiated with the light.

In such an embodiment, even when the resistance values of the resistors are distributed within a wide range, the difference between resistance values obtained by cutting at least one of the resistors off can be reduced.

A semiconductor device according to the present invention includes: a semiconductor substrate on which a semiconductor circuit is formed; and a regulating resistor network, formed on the semiconductor substrate, for regulating a voltage or current supplied to the semiconductor circuit. The regulating resistor network includes a plurality of resistors connected in parallel to each other. Each said resistor is cuttable by being irradiated with light, and a resistance value of the regulating resistor network is adjustable by cutting at least one of the resistors off.

In the semiconductor device according to the present invention, the resistance value of the regulating resistor network is adjustable only by cutting at least one of the resistors off, and therefore, the time taken to adjust the resistance value of the resistor network can be much shorter. In addition, the light irradiation time and heat quantity required for the fine adjustment of the resistance value can also be reduced. Thus, even if a semiconductor circuit is integrated with the regulating resistor network on the same semiconductor substrate, the semiconductor circuit receives much smaller damage. Accordingly, it is possible to integrate the semiconductor circuit with the regulating resistor network for regulating the voltage or current supplied to the semiconductor circuit on the same semiconductor substrate.

In one embodiment of the present invention, the resistors preferably have mutually different resistance values. In such an embodiment, a great number of resistance value combinations can be created by cutting a variable number of resistors off.

In this particular embodiment, the resistors are preferably of mutually different lengths. In such an embodiment, even if a size error occurred among the resistors formed by patterning a metal thin film, the resistance value of the regulating resistor network does not deviate from its desired value so much and is still finely adjustable.

In another embodiment of the present invention, the resistor network preferably further includes a fixed resistor, which is connected in parallel to the resistors and is not cuttable by being irradiated with the light.

In such an embodiment, even when the resistance values of the resistors are distributed within a wide range, the difference between resistance values obtained by cutting at least one of the resistors off can be reduced.

In still another embodiment, the semiconductor circuit may be a field effect transistor, and the regulating resistor network is preferably connected to the gate terminal of the field effect transistor. And a bias voltage applied to the gate terminal of the field effect transistor is preferably regulable by adjusting the resistance value of the regulating resistor network.

In such an embodiment, the field effect transistor and the regulating resistor network for regulating the gate bias voltage of the field effect transistor can be integrated on the same semiconductor substrate.

An inventive method for fabricating a semiconductor device includes the step of a) forming a semiconductor circuit and a regulating resistor network on a semiconductor substrate. The resistor network includes a plurality of resistors and regulates a voltage or current supplied to the semiconductor circuit. Each said resistor is cuttable by being irradiated with light. The method further includes the step of b) cutting at least one of the resistors off by irradiating the resistor with the light, thereby adjusting a resistance value of the regulating resistor network.

According to the method of the present invention, it is possible to shorten the time needed for adjusting the resistance value of the regulating resistor network. In addition, a semiconductor device, in which a semiconductor circuit is integrated with the regulating resistor network on the same semiconductor substrate and yet receives little damage during the adjustment of the resistance value, can be fabricated just as intended.

In one embodiment of the present invention, the resistor network preferably further includes a fixed resistor, which is connected in parallel to the resistors and is not cuttable by being irradiated with the light.

In such an embodiment, even when the resistance values of the resistors are distributed within a wide range, the difference between resistance values obtained by cutting at least one of the resistors off can be reduced.

In another embodiment, the light for cutting at least one of the resistors off is preferably pulsed YAG laser radiation.

In such an embodiment, the YAG laser radiation is easily absorbable into the resistors in the network, but hardly absorbable into the semiconductor substrate. Thus, the semiconductor circuit, which is formed on the same semiconductor substrate as the regulating resistor network, receives lesser damage upon the irradiation of the laser radiation. Also, since the YAG laser radiation is pulsed, damage done to the semiconductor circuit by the laser irradiation is even smaller.

In still another embodiment, the step b) preferably includes irradiating the regulating resistor network with the light through a mask. The mask preferably includes a plurality of openings at respective locations corresponding to the resistors. Some of the openings associated with the at least one resistor to be cut off should be opened but the other openings associated with the remaining resistors not to be cut may be closed during the irradiation of the light.

In such an embodiment, no matter how many resistors should be cut off, those resistors can be cut simultaneously and accurately.

In still another embodiment, the step b) preferably includes measuring an operation characteristic value of the semiconductor circuit and cutting at least one of the resistors off so as to reduce a difference between the characteristic value measured and a target characteristic value preset for the semiconductor circuit.

In such an embodiment, the process step of adjusting the resistance value of the regulating resistor network can be incorporated into a test process for the semiconductor circuit. Thus, the process step of adjusting the resistance value of the regulating resistor network can be performed on the semiconductor substrate on a semiconductor wafer.

In still another embodiment, the semiconductor circuit may be a field effect transistor, the regulating resistor network is preferably connected to the gate terminal of the field effect transistor, and the step b) preferably includes regulating a bias voltage applied to the gate terminal of the field effect transistor.

In such an embodiment, the field effect transistor and the regulating resistor network for regulating the gate bias voltage of the field effect transistor can be integrated on the same semiconductor substrate.

BRIEF DESCRIPTION OF THE DRAWINGS

FIG. 1(*b*) illustrates a regulating resistor network for the semiconductor device according to the first embodiment.

DESCRIPTION OF THE PREFERRED EMBODIMENTS

Embodiment 1

Hereinafter, regulating resistor network and semiconductor device according to a first exemplary embodiment of the present invention will be described with reference to FIGS. 1(a), 1(b) and 2.

Figure 1A:
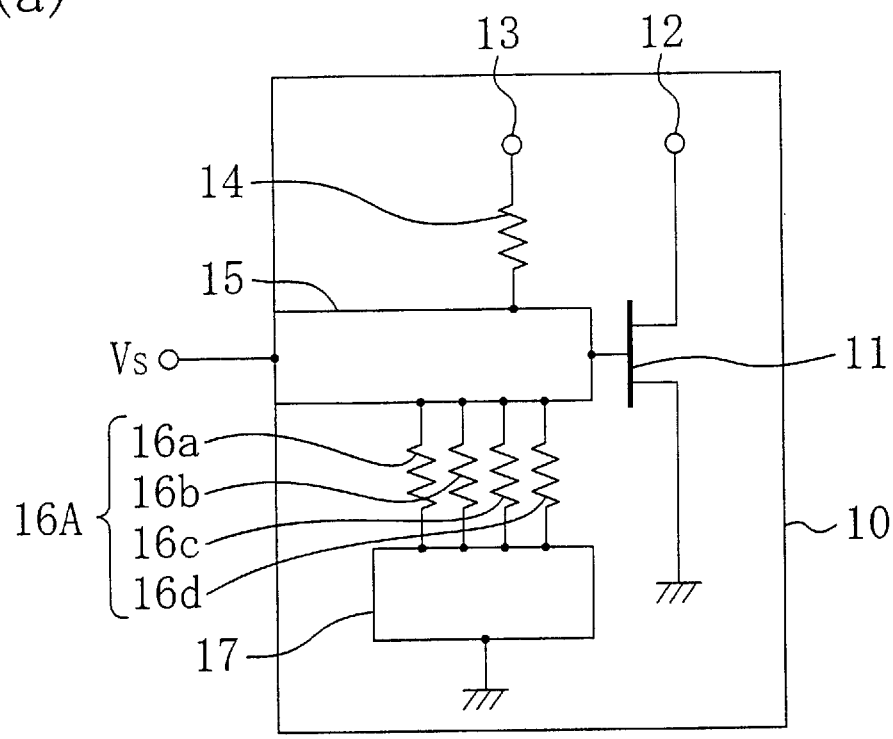
FIG. 1(*a*) illustrates an overall arrangement of a semiconductor device according to a first embodiment of the present invention.

FIG. 1(a) illustrates an overall arrangement of a semiconductor device according to the first embodiment. An FET 11 is formed as an amplifier on a semiconductor substrate (semiconductor chip) 10, which is mounted on a semiconductor wafer (not shown) of GaAs, for example. The drain terminal of the FET 11 is connected to a drain voltage supply terminal 12, while the source terminal thereof is grounded.

A resistance adjustment circuit for regulating a bias voltage applied to the gate terminal of the FET 11 is formed on the semiconductor substrate 10 and connected to the gate terminal of the FET 11. The resistance adjustment circuit includes a voltage supply terminal 13, a voltage divider 14, a gate voltage supply terminal 15, a regulating resistor network 16A and a ground terminal 17, which are connected in series to each other. The gate voltage supply terminal 15 is connected to a signal input terminal $V_S$ provided on a printed wiring board (not shown) and to the gate terminal of the FET 11.

The regulating resistor network 16A consists of first, second, third and fourth thin-film resistors 16a, 16b, 16c and 16d, which are connected in parallel to each other between the gate voltage supply terminal 15 and the ground terminal 17.

Figure 1B:
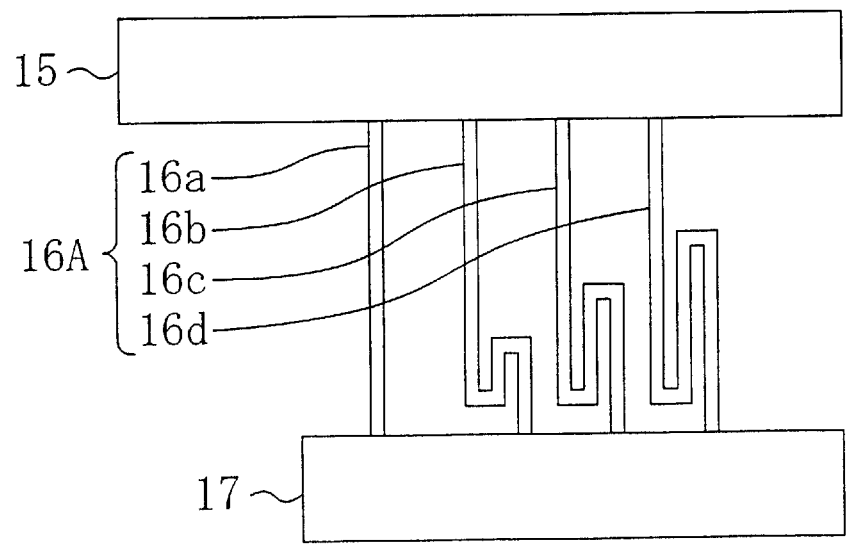

FIG. 1(b) illustrates a planar layout for the regulating resistor network 16A. As shown in FIG. 1(b), the first through fourth thin-film resistors 16a through 16d, which are formed out of a metal thin film of tungsten silicon nitride (WSiN), for example, to have a thickness of 0.1 $\mu$m and mutually different lengths, are connected in parallel to each other between the gate voltage supply and ground terminals 15 and 17. Each of the first through fourth thin-film resistors 16a through 16d is cuttable in 10 plus nanoseconds by being irradiated with laser light such as YAG laser radiation. The voltage divider 14 may also be made of the metal thin film of WSi during the same process as the first through fourth thin-film resistors 16a through 16d.

Suppose $V_D$ is a voltage applied to the voltage supply terminal 13, $V_g$ is a bias voltage applied to the gate terminal of the FET 11 and $R_0$ and $R_A$ are resistance values of the voltage divider 14 and the regulating resistor network 16A, respectively. Then, $V_g = V_D \times (R_A/(R_A+R_0))$ is met.

Also, supposing $R_1$, $R_2$, $R_3$ and $R_4$ are respective resistance values of the first, second, third and fourth thin-film resistors 16a, 16b, 16c and 16d, the following relationship $$1/R_A = (1/R_1) + (1/R_2) + (1/R_3) + (1/R_3)$$

is met.

In this case, if the first thin-film resistor 16a is cut off, then the resistance value $R_1$ of the first thin-film resistor 16a becomes substantially infinity. Accordingly, $$1/R_A = (1/R_2) + (1/R_3) + (1/R_3)$$

is met.

As can be seen, if at least one of the first through fourth thin-film resistors 16a through 16d is/are selectively cut off, then the resistance value $R_A$ of the regulating resistor network 16A can be adjusted at an appropriate value as shown in the following Table 1. Thus, the bias voltage $V_g$ applied to the gate terminal of the FET 11 is regulable.

TABLE 1

|    | 1 | 2 | 3 | 4 | 5 | 6 | 7 | 8 | 9 | 10 | 11 | 12 | 13 | 14 | 15 |
|----|---|---|---|---|---|---|---|---|---|----|----|----|----|----|----|
| R1 | 1 | 1 | 1 | 1 | 0 | 1 | 1 | 1 | 0 | 0  | 0  | 1  | 0  | 0  | 0  |
| R2 | 1 | 1 | 1 | 0 | 1 | 1 | 0 | 0 | 1 | 1  | 0  | 0  | 1  | 0  | 0  |
| R3 | 1 | 1 | 0 | 1 | 1 | 0 | 1 | 0 | 1 | 0  | 1  | 0  | 0  | 1  | 0  |
| R4 | 1 | 0 | 1 | 1 | 1 | 0 | 0 | 1 | 0 | 1  | 1  | 0  | 0  | 0  | 1  |

In Table 1, the numerals on the top row indicate combination numbers of thin-film resistors. At least one of the first through fourth thin-film resistors 16a through 16d is/are selectively cut off as indicated by zeros, except for the combination No. 1 in which none of the resistors are cut off as indicated by ones. Since there are four thin-film resistors in this case, 16 combinations are formed by cutting at least one of these thin-film resistors computationally speaking. If all of these thin-film resistors are cut off, however, the resistance value of the regulating resistor network 16A becomes substantially infinity. Thus, the number of actually executable combinations, except for the case where all the resistors are cut off, is 15. In the illustrated embodiment, the resistance of the first through fourth thin-film resistors 16a through 16d is preset at mutually different values. Accordingly, there will be a great number of resistance value combinations created for the regulating resistor network 16A by cutting at least one of the thin-film resistors off.

Figure 2:
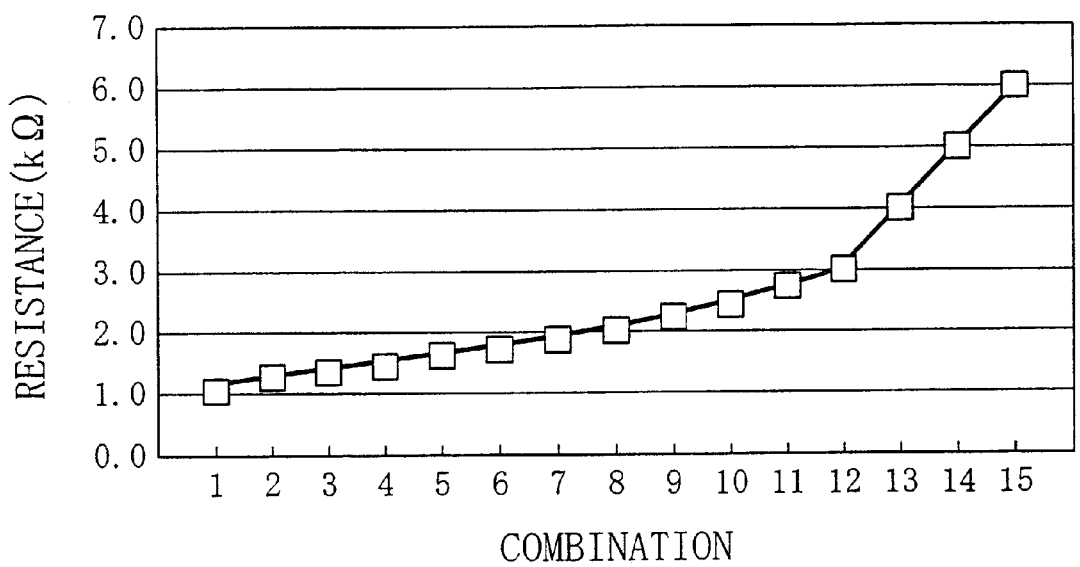
FIG. 2 is a graph illustrating how a resistance value changes with a combination of thin-film resistors to be cut off, which are selected from first through fourth resistors included in the regulating resistor network for the semiconductor device according to the first embodiment.

FIG. 2 illustrates respective resistance values $R_A$ of the regulating resistor network 16A corresponding to the individual combinations shown in Table 1, where the resistance values $R_1$, $R_2$, $R_3$ and $R_4$ of the first, second, third and fourth thin-film resistors 16a, 16b, 16c and 16d are 3, 4, 5 and 6 kΩ, respectively.

Once a desired resistance value of the regulating resistor network 16A is determined, an associated combination formed by cutting at least one of the first through fourth thin-film resistors 16a through 16d is known from FIG. 2 and Table 1. Thus, the thin-film resistor(s) to be removed are cut off by being irradiated with laser light such as YAG laser radiation.

If YAG laser radiation is used for cutting the thin-film resistors off, then the thin-film resistors are cuttable quickly and yet the semiconductor substrate 10 receives little damage. This is because YAG laser radiation is well absorbable into the metal thin film as a material for the thin-film resistors, but hardly absorbable into the semiconductor substrate 10 of GaAs, for example.

Also, if YAG laser radiation is applied in pulses, then the semiconductor substrate 10 receives even smaller damage, because the laser irradiation time is very short in such a case.

Embodiment 2

Next, regulating resistor network and semiconductor device according to a second exemplary embodiment of the present invention will be described with reference to FIGS. 3(a), 3(b) and 4.

Figure 3A:
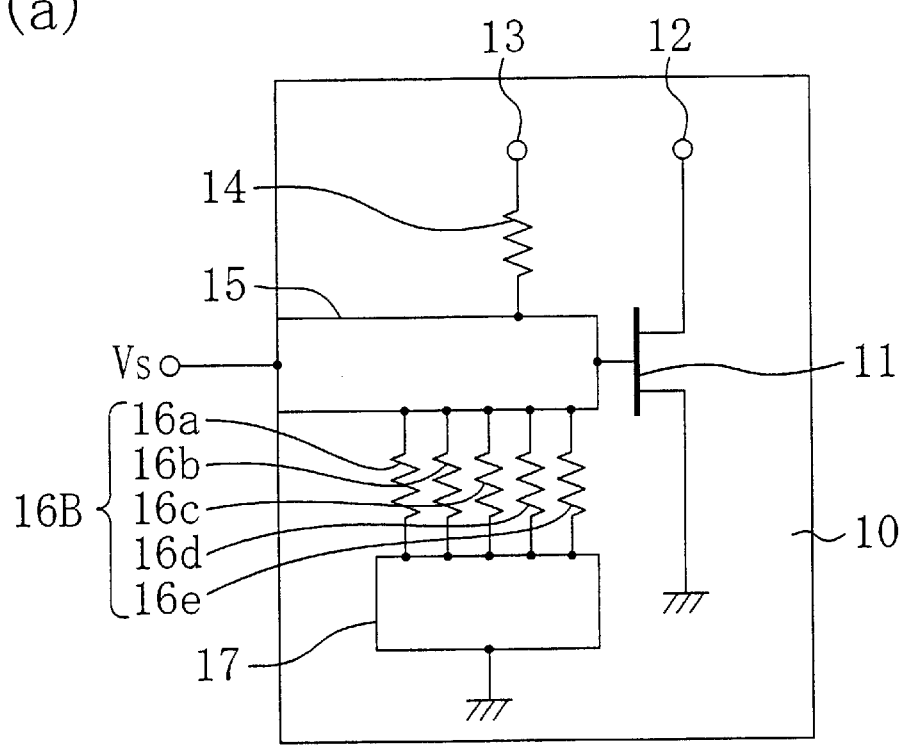
FIG. 3(a) illustrates an overall arrangement of a semiconductor device according to a second embodiment of the present invention.
Figure 3B:
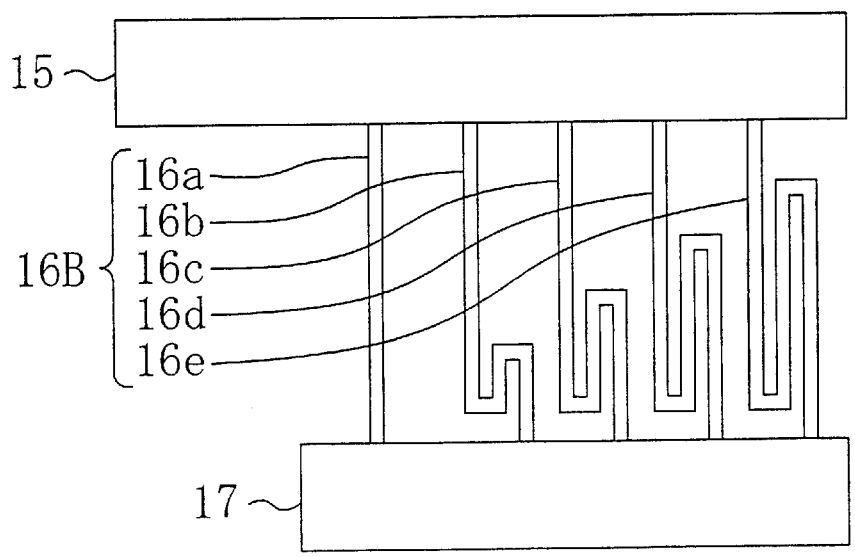
FIG. 3(b) illustrates a regulating resistor network for the semiconductor device according to the second embodiment.

FIG. 3(a) illustrates an overall arrangement of a semiconductor device according to the second embodiment, while FIG. 3(b) illustrates a planar layout of a regulating resistor network 16B for the semiconductor device according to the second embodiment. The second embodiment is the same as the first embodiment except that the regulating resistor network 16B of the second embodiment has a different construction from that of the resistor network 16A of the first embodiment. Thus, the same components as those used in the first embodiment will be identified by the same reference numerals, and the description thereof will be omitted herein.

According to the second embodiment, the regulating resistor network 16B consists of first, second, third, fourth and fifth thin-film resistors 16a, 16b, 16c, 16d and 16e, which are connected in parallel to each other between the gate voltage supply terminal 15 and the ground terminal 17. The first through fifth thin-film resistors 16a through 16e are formed out of a metal thin film of WSiN, for example, to have mutually different lengths. Each of the first through fourth thin-film resistors 16a through 16d is cuttable in 10 plus nanoseconds by being irradiated with laser light such as YAG laser radiation. In contrast, the fifth thin-film resistor 16e has a resistance value larger than those of the first through fourth thin-film resistors 16a through 16d and is non-cuttable by the laser light.

That is to say, according to the second embodiment, at least one of the first through fourth thin-film resistors 16a through 16d is/are cut off without cutting the fifth thin-film resistor 16e. Thus, the number of combinations formed by cutting at least one of the thin-film resistors is 16 in this embodiment.

Figure 4:
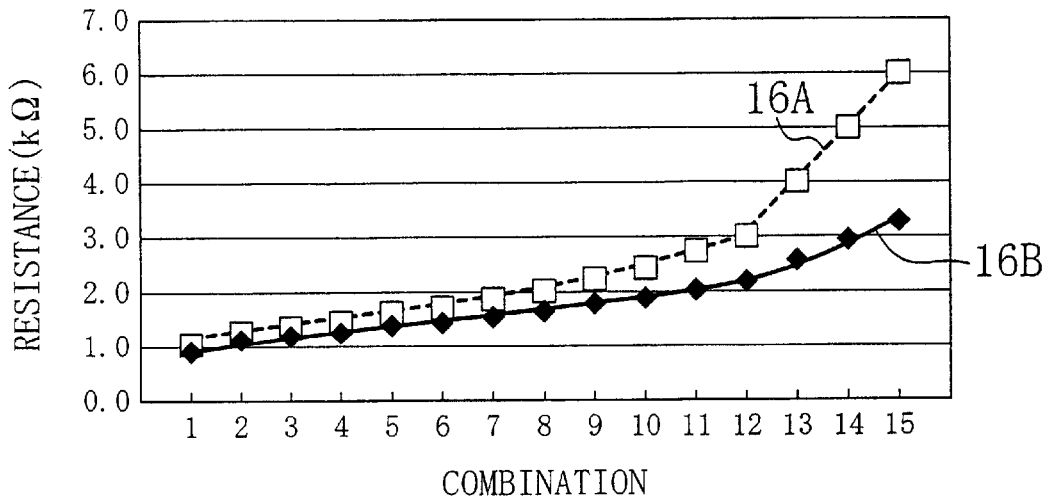
FIG. 4 is a graph illustrating how a resistance value changes with a combination of thin-film resistors to be cut off, which are selected from first through fourth resistors included in the regulating resistor network for the semiconductor device according to the second embodiment.

FIG. 4 illustrates respective resistance values $R_B$ of the regulating resistor network 16B corresponding to the individual combinations shown in Table 1, where the resistance values $R_1$, $R_2$, $R_3$, $R_4$ and $R_5$ of the first through fifth thin-film resistors 16a, 16b, 16c, 16d and 16e are 3, 4, 5, 6 and 7 kΩ, respectively. In FIG. 4, the resistance values $R_A$ of the regulating resistor network 16A according to the first embodiment are represented by the broken-line curve, while the resistance values $R_B$ of the regulating resistor network 16B according to the second embodiment are represented by the solid-line curve.

As can be seen from FIG. 4, the variation in resistance of the regulating resistor network 16B according to the second embodiment is gentler than that of the regulating resistor network 16A according to the first embodiment. In other words, a difference between resistance values associated with a pair of adjacent combinations can be reduced according to the second embodiment. This is because the regulating resistor network 16B additionally includes the non-cuttable fifth thin-film resistor 16e. Thus, the regulating resistor network 16B is particularly effective if a difference between resistance values associated with a pair of adjacent combinations formed by cutting off a large number of thin-film resistors is much larger than a difference between resistance values associated with another pair of adjacent combinations formed by cutting off a small number of thin-film resistors.

Hereinafter, a specific method for presetting the resistance values of the thin-film resistors at mutually different values in the regulating resistor networks 16A and 16B according to the foregoing embodiments will be described.

To preset the resistance values of the respective thin-film resistors included in the regulating resistor network 16A or 16B at mutually different values, at least one of the material, cross-sectional area and length should be changed for the respective thin-film resistors. If these thin-film resistors are formed during the same process, however, all of these thin-film resistors should be made of the same material to an equal thickness. Accordingly, the thin-film resistors should have mutually different lengths or widths to make the resistance values thereof different from each other.

The thin-film resistors included in the regulating resistor network 16A or 16B according to the first or second embodiment may be formed by a known technique. Specifically, first, a metal thin film is deposited over the entire surface of the semiconductor substrate 10. Next, a resist pattern is defined by photolithography on the metal thin film. And then the metal thin film is patterned using the resist pattern as a mask.

In this case, the feature size of the resist pattern formed by photolithography has a tolerance of about ±0.1 μm from its desired value. Also, in etching and patterning a metal thin film with a thickness of 0.1 μm, each thin-film resistor reduces its width by about 0.2 μm in total due to unintentional side etching. Accordingly, in the worst-case scenario, the width of a thin-film resistor formed by patterning the metal thin film with a thickness of 0.1 μm may be smaller than its desired value by as much as about 0.3 μm. It should be noted that neither an error resulting from photolithography or an error caused by side etching depends on the width of the thin-film resistor.

Figure 5:
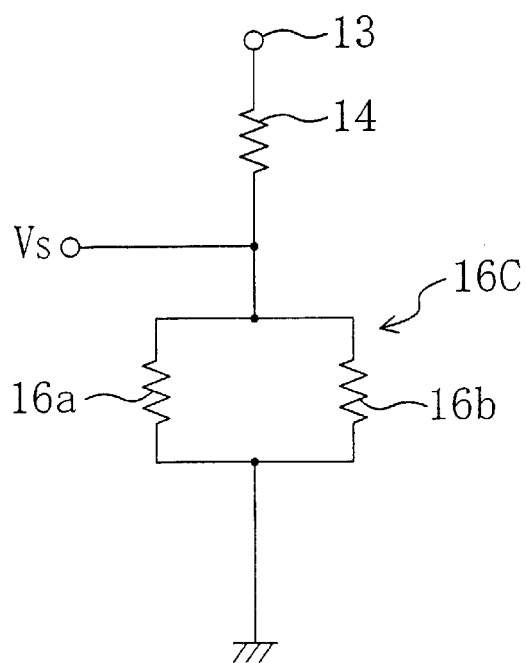
FIG. 5 is a circuit diagram illustrating how a variation in resistance among the thin-film resistors included in the regulating resistor network for the semiconductor device according to the first or second embodiment affects the resistance value of a resistance adjustment circuit.

FIG. 5 illustrates a resistance adjustment circuit. In the resistance adjustment circuit, the voltage divider 14 (with a resistance value $R_0$) and a regulating resistor network 16C (with a resistance value $R_C$) are connected in series to the voltage supply terminal 13. And the regulating resistor network 16C consists of first and second thin-film resistors 16a and 16b connected in parallel to each other.

Suppose the resistance values of the voltage divider 14 and the first and second thin-film resistors 16a and 16b are preset at 4, 1 and 2 kΩ, respectively, in the resistance adjustment circuit shown in FIG. 5.

First, consider a situation where the resistance values of the voltage divider 14 and the first and second thin-film resistors 16a and 16b are made different from each other by differentiating the widths of these resistors while equalizing their lengths with each other. In such a case, the width ratio among the voltage divider 14 and the first and second thin-film resistors 16a and 16b may be set at 1:4:2. Then, the resistance division ratio of the resistance adjustment circuit is: $R_C/(R_C+R_0)=0.143$.

Suppose the widths of the voltage divider 14 and the first and second thin-film resistors 16a and 16b have decreased from their preset values, e.g., 1, 4 and 2 μm, by 0.3 μm each (i.e., their widths are now 0.7, 3.7 and 1.7 μm). In such a case, the resistance values thereof increase to 5.71, 1.08 and 2.35 kΩ, respectively, and the resistance division ratio of the resistance adjustment circuit is: $R_C/(R_C+R_0)=0.115$, which is about 20% decrease from the preset value of 0.143.

Next, consider a situation where the resistance values of the voltage divider 14 and the first and second thin-film resistors 16a and 16b are made different from each other by differentiating the lengths of these resistors while equalizing their widths with each other. In such a case, the resistance value of each of these resistors increases or decreases from its preset value at the same ratio, because the width of each of these resistors also increases or decreases from its preset value at the same ratio. Thus, the resistance division ratio $R_C/(R_C+R_0)$ of the resistance adjustment circuit does not change.

Accordingly, if the resistance values of the voltage divider 14 and the first through fifth thin-film resistors 16a through 16e are made different from each other by differentiating their lengths while equalizing their widths with each other, then these resistance values and the resistance division ratio of the resistance adjustment circuit are not affected by the error resulting from lithography and etching process steps.

Also, if the voltage divider 14 and the first through fifth thin-film resistors 16a through 16e are made of the same metal thin film, then their thicknesses increase or decrease at the same ratio even if the thickness of the metal thin film deposited has deviated from its preset value. Thus, the resistance division ratio of the resistance adjustment circuit is not affected.

Moreover, if the voltage divider 14 and the first through fifth thin-film resistors 16a through 16e are made of the same metal thin film, then their resistance values increase or decrease at the same ratio with a temperature variation. Thus, the resistance division ratio of the resistance adjustment circuit is not affected, either.

Embodiment 3

Hereinafter, a method for forming the regulating resistor network 16A or 16B according to the first or second embodiment will be described as a third exemplary embodiment of the present invention.

As described above, first, a metal thin film is deposited over the entire surface of the semiconductor substrate 10. Next, a resist pattern is defined by photolithography on the metal thin film. And then the metal thin film is patterned using the resist pattern as a mask, thereby forming the regulating resistor network 16A or 16B according to the first or second embodiment.

Next, the process step of cutting off at least one of the first through fourth thin-film resistors 16a through 16d included in the regulating resistor network 16A or 16B according to the first or second embodiment will be described with reference to FIG. 6. The FET 11, the voltage divider 14 and so on are actually formed on the semiconductor substrate 10, but are omitted from FIG. 6 for the sake of simplicity.

Figure 6:
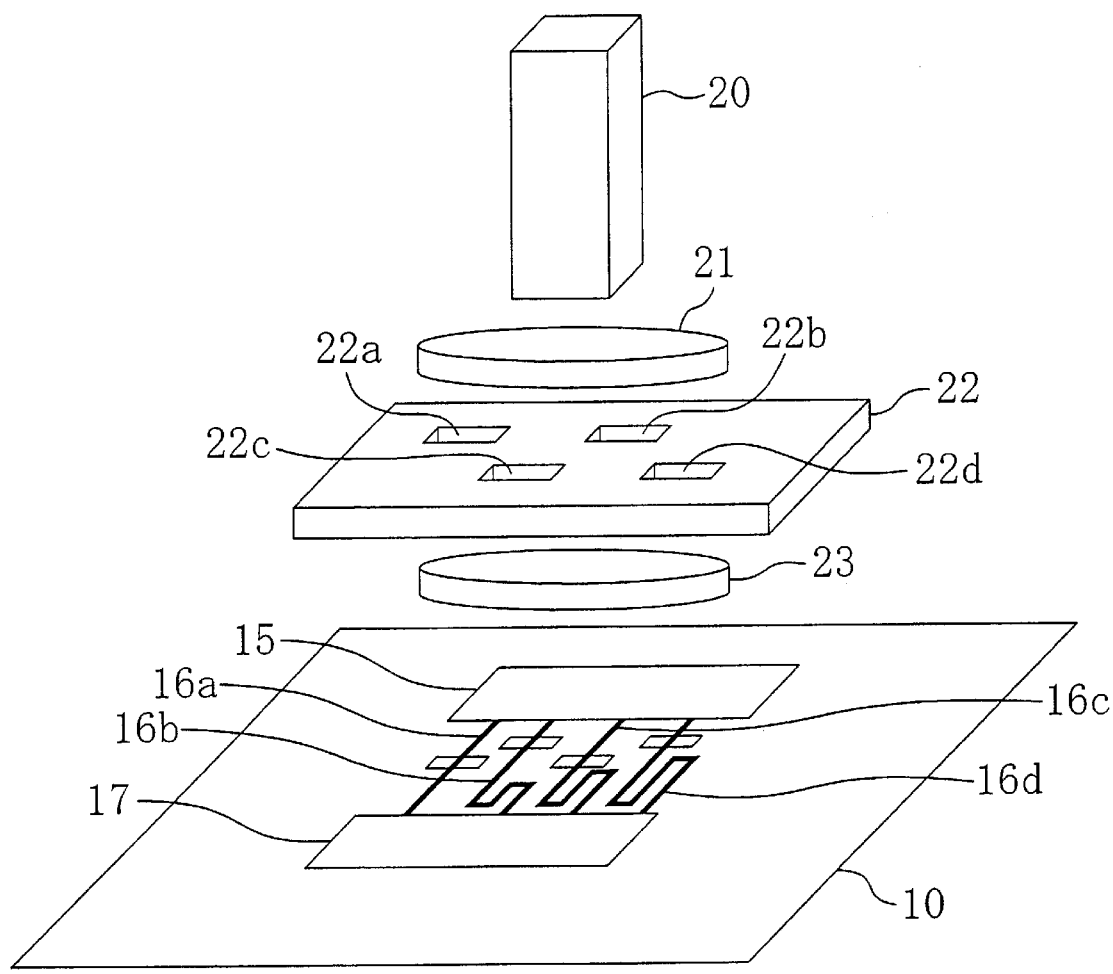
FIG. 6 is a perspective view illustrating an overall arrangement of an optical system used for cutting off at least one of the thin-film resistors included in the regulating resistor network during a fabrication process of a semiconductor device according to a third embodiment of the present invention.

FIG. 6 illustrates an overall arrangement of an optical system for fusing and cutting off the first, second, third and/or fourth thin-film resistors 16a through 16d. The optical system includes: a laser light source 20; a first optical lens 21; a mask 22; and a second optical lens 23. The light source 20 emits YAG laser radiation in pulses. The first optical lens 21 magnifies the irradiation area of the laser light emitted from the laser light source 20. The mask 22 selectively transmits the light passed through the first optical lens 21. And the second optical lens 23 converges the light, which has been transmitted through the mask 22, onto a target spot on the semiconductor substrate 10.

The mask 22 is provided with first, second, third and fourth openings 22a, 22b, 22c and 22d at respective locations corresponding to the cut portions of the first, second, third and fourth thin-film resistors 16a, 16b, 16c and 16d. The laser beams passed through the first through fourth openings 22a through 22d are imaged by the second optical lens 23 at the respective cut portions of the first through fourth thin-film resistors 16a through 16d. In other words, imaging relationship is established by the second optical lens 23 between the first through fourth openings 22a through 22d of the mask 22 and the first through fourth thin-film resistors 16a through 16d. In FIG. 6, the rectangular frames drawn over the first through fourth thin-film resistors 16a through 16d represent the spots of beams converged by the second optical lens 23.

Since the laser light emitted from the laser light source 20 gets the irradiation area thereof magnified by the first optical lens 21, only the central portion of the laser emission is transmitted through the first through fourth openings 22a through 22d of the mask 22. Thus, the intensity distribution of the optical energy transmitted through the first through fourth openings 22a through 22d is substantially uniform. As a result, the first through fourth thin-film resistors 16a through 16d can be cut almost equally.

Also, since the beams transmitted through the first through fourth openings 22a through 22d of the mask 22 are converged by the second optical lens 23, high energy is applicable to the respective cut portions of the first through fourth thin-film resistors 16a through 16d.

Figure 7:
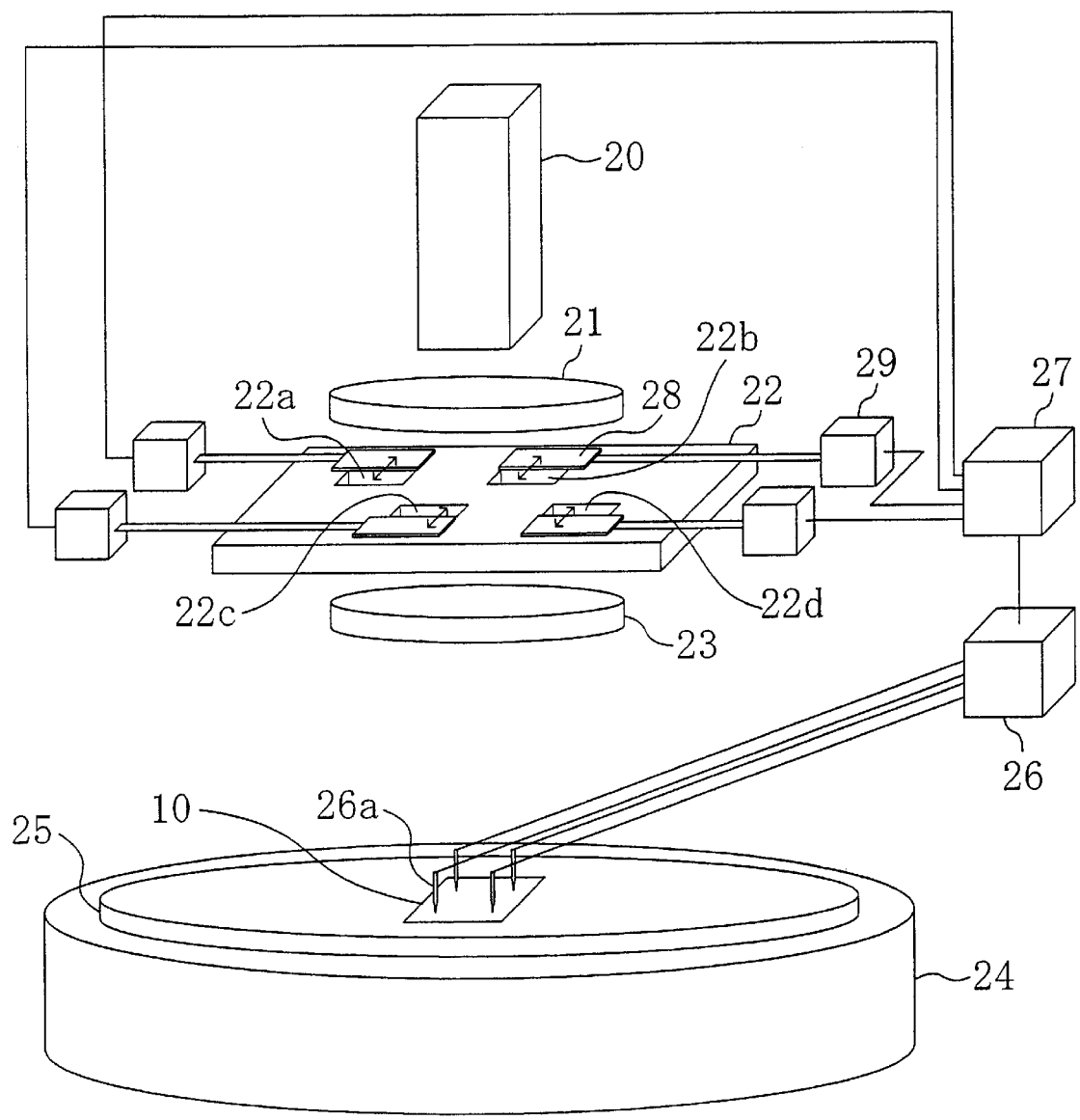
FIG. 7 is a perspective view illustrating an overall arrangement of a resistance adjustment system used for adjusting the resistance value of the regulating resistor network by cutting off at least one of the thin-film resistors included in the network during the fabrication process of the semiconductor device according to the third embodiment.

FIG. 7 illustrates an overall arrangement of a resistance adjustment system for adjusting the resistance value of the regulating resistor network 16A or 16B by cutting off at least one of the first through fourth thin-film resistors 16a through 16d. The same optical system as that shown in FIG. 6 is incorporated into this resistance adjustment system. Thus, the same component will be identified by the same reference numerals and the description thereof will be omitted herein.

As shown in FIG. 7, a horizontal stage 24, which is movable horizontally, is provided under the optical system. A semiconductor wafer 25, mounting the semiconductor substrate 10 thereon, is placed on the horizontal stage 24.

A plurality of probe needles 26a of a measuring unit 26 for measuring the operating current of the FET formed on the semiconductor substrate 10 are in contact with the semiconductor substrate 10. The operating current values measured by the measuring unit 26 are provided to a controller 27 for controlling the opened/closed states of the first through fourth openings 22a through 22d of the mask 22.

Also, light blocking plates 28 are placed beside the first through fourth openings 22a through 22d of the mask 22 and coupled to respective drivers 29 implemented as piezoelectric devices.

Responsive to the operating current value of the FET measured by and supplied from the measuring unit 26, the controller 27 determines through computations which of the first through fourth thin-film resistors 16a through 16d on the semiconductor substrate 10 should be cut off to minimize the difference between the actual operating current of the FET and the preset value thereof. And based on the results of computations, the controller 27 determines whether each of the first through fourth openings 22a through 22d of the mask 22 should be opened or closed, thereby instructing the drivers 29 to drive the light-blocking plates 28 as such.

Figure 8:
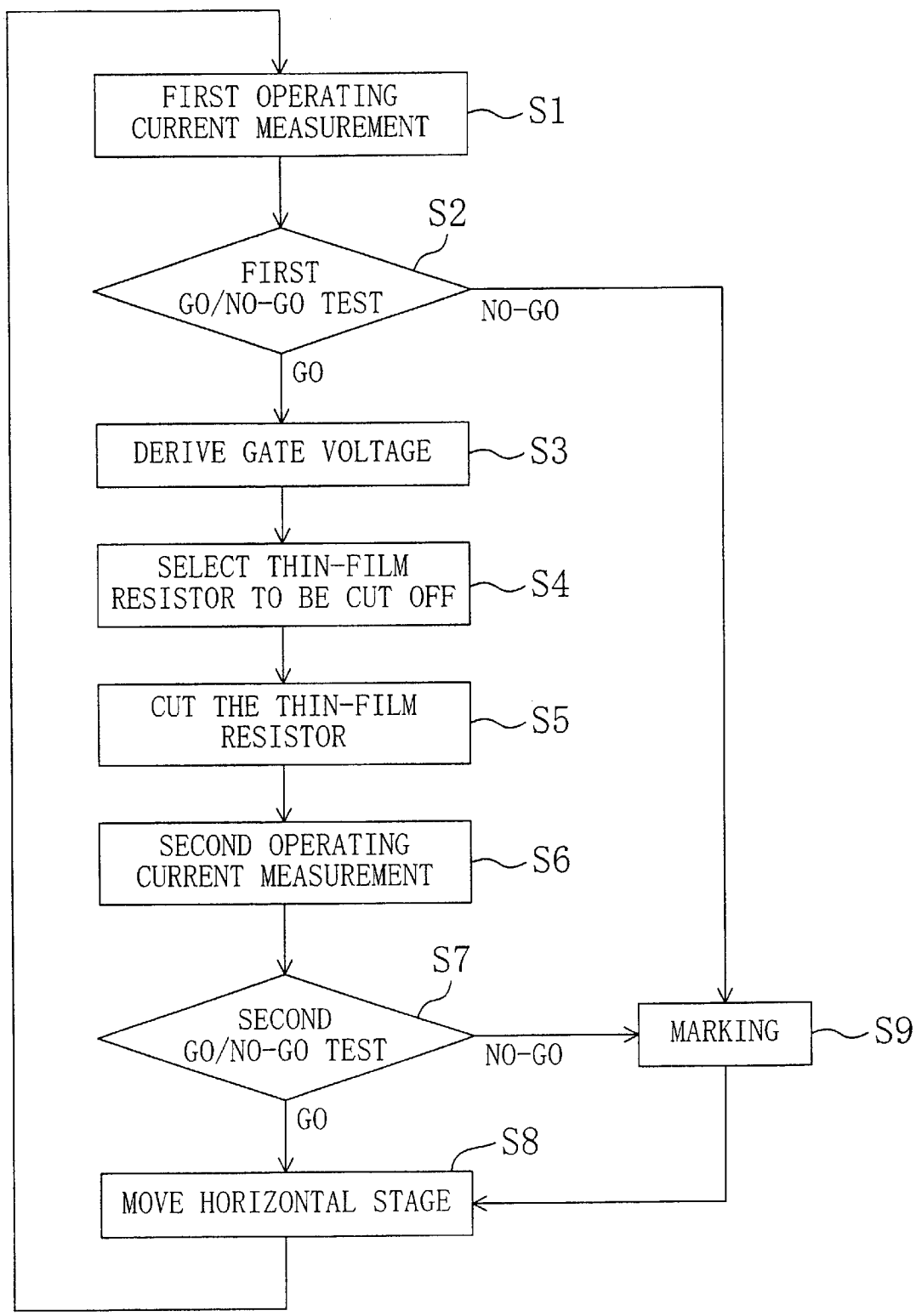
FIG. 8 is a flowchart illustrating the flow of respective process steps of a method for fabricating the semiconductor device according to the third embodiment.

Hereinafter, an exemplary procedure of a test carried out on the FET formed on the semiconductor substrate 10 will be described with reference to the flowchart in FIG. 8.

First, in Step S1, the operating current of the FET is measured for the first time. Specifically, one of the probe needles 26a of the measuring unit 26 makes contact with the gate terminal of the FET, while two other probe needles 26a make contact with the drain and source terminals of the FET. In such a state, the current flowing between the drain and source terminals of the FET is measured with a variable gate voltage applied to the gate terminal of the FET.

Next, in Step S2, it is determined for the first time based on the operating characteristic value of the FET whether the FET is GO or NO-GO. More specifically, it is determined whether or not the operating current measured by the measuring unit 26 is within a prescribed range. In this specification, the "prescribed range" means a range in which the FET is qualified for a GO product if the resistance value of the regulating resistor network 16A or 16B in the resistance adjustment circuit connected to the gate terminal is adjusted.

Next, if the result of the first GO/NO-GO test is "GO", then the gate voltage to be applied to the gate terminal of the FET is derived in Step S3. Specifically, various gate voltages, which are associated with the respective resistance values of the regulating resistor network 16A or 16B shown in FIG. 2 or 4, are applied to the gate terminal, thereby measuring the resulting operating current values of the FET. And a gate voltage associated with an operating current closest to the desired operating current (i.e., a predetermined optimum operating current) is selected from these various gate voltages.

Then, in Step S4, it is determined which of the first through fourth thin-film resistors should be cut off to apply the gate voltage derived in Step S3 to the gate terminal of the FET. Subsequently, in Step S5, the selected thin-film resistor is cut off. Specifically, the controller 27 determines whether each of the first through fourth openings 22a through 22d of the mask 22 should be opened or closed and instructs the drivers 29 to drive the light-blocking plates 28 as determined. And the laser light source 20 is driven to emit laser radiation toward the mask 22, thereby cutting the selected thin-film resistor off.

Next, in Step S6, the operating current of the FET is measured for the second time. Then, in Step S7, it is determined for the second time based on the re-measured operating current value of the FET whether the FET is GO or NO-GO.

Subsequently, if the result of the second GO/NO-GO test is "GO", the horizontal stage is moved in Step S8, and then the procedure returns to Step S1 to start to test another FET formed on another semiconductor substrate.

On the other hand, if the FET is evaluated as exhibiting "NO-GO" operating characteristic in Step S2 or S7, then the semiconductor substrate 10 including such a defective FET is marked with ink, for example, in Step S9. Thereafter, the horizontal stage is moved in Step S8, and then the procedure returns to Step S1 to start to test another FET formed on another semiconductor substrate.

The foregoing process steps will be performed on all the semiconductor substrates 10 included in the semiconductor wafer 25.

As can be seen, according to the third embodiment, measurement of the operating current of the FET on the semiconductor substrate 10, GO/NO-GO test of the FET and resistance adjustment of the regulating resistor network 16A or 16B in the resistance adjustment circuit can be all performed at a wafer level (i.e., in the state where the semiconductor substrate 10 is still included in the semiconductor wafer 25). Thus, the time taken to adjust the resistance value of the resistance adjustment circuit can be shortened.

In the foregoing first through third embodiments, the semiconductor circuit formed on the semiconductor substrate is supposed to be an FET. Alternatively, the semiconductor circuit may be an operational amplifier used for the inverting amplifier shown in FIG. 9. In such a case, the regulating resistor may be a first resistor connected to the signal input terminal of the operational amplifier or a second resistor connected to the feedback loop of the operational amplifier.

Figure 9:
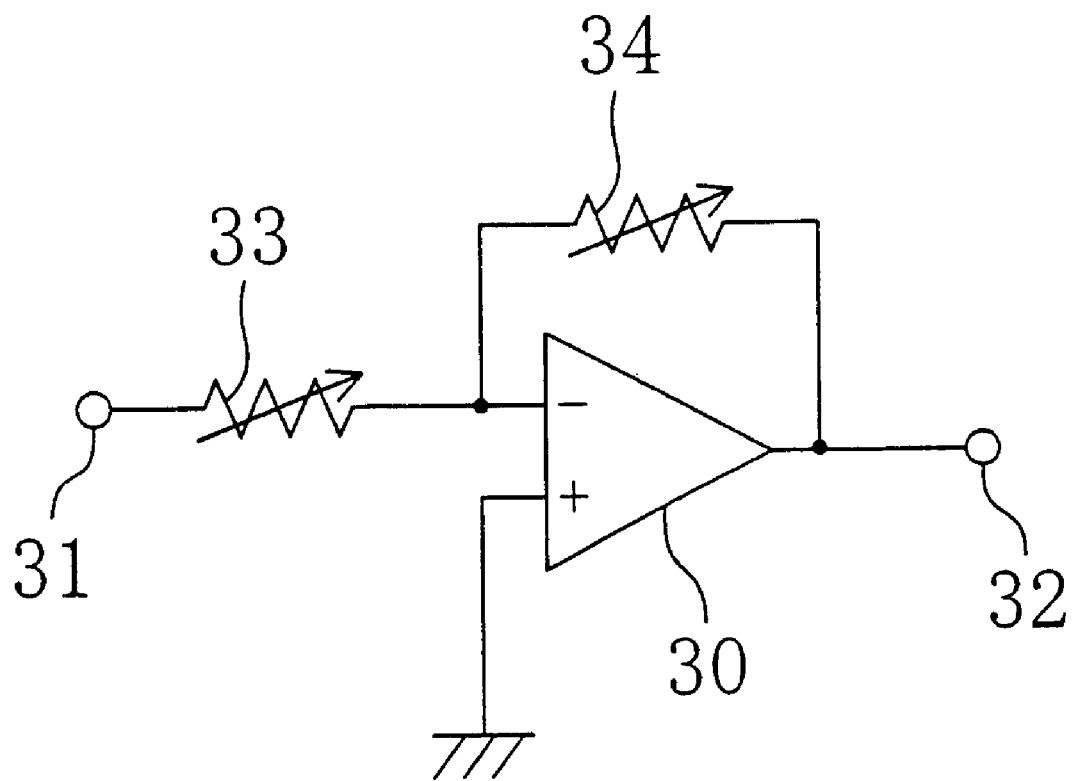
FIG. 9 is a circuit diagram illustrating another exemplary semiconductor circuit integrated in the semiconductor device according to the first, second or third embodiment.
Figure 10A:
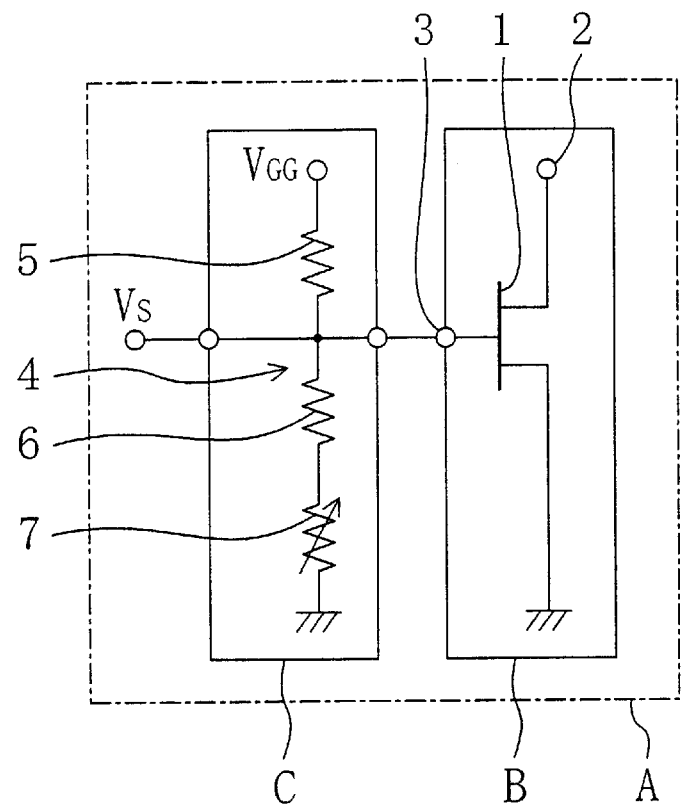
FIG. 10(a) illustrates an overall arrangement of a semiconductor device including a conventional trimming resistor.
Figure 10B:
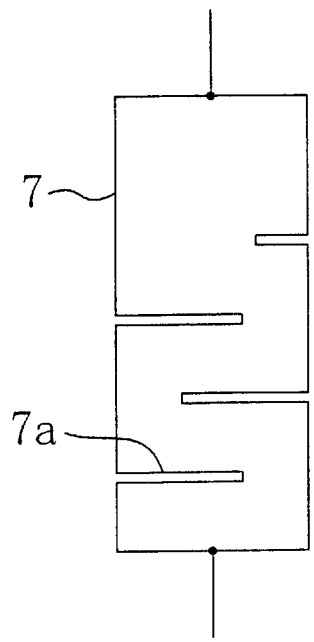
FIG. 10(b) illustrates how the resistance value of the conventional trimming resistor is adjusted.

In the inverting amplifier shown in FIG. 9, a first resistor 33 is connected between an operational amplifier 30 and a signal input terminal 31, and a second resistor 34 is connected to a feedback loop from a signal output terminal 32 to the operational amplifier 30.

The characteristics of the operational amplifier 30, which is implemented as a bipolar transistor, can be determined by external devices provided for an external circuit without considering the characteristics of the internal circuit. Supposing the resistance values of the first and second resistors 33 and 34 are $R_P$ and $R_Q$, respectively, the gain A of the operational amplifier 30 is represented as: $A=-R_Q/R_P$. That is to say, if at least one of the resistance values $R_P$ and $R_Q$ of the first and second resistors 33 and 34 is changed, the gain A, which is an important characteristic of the operational amplifier 30, can be changed.

Thus, the regulating resistor network 16A or 16B according to the first or second embodiment is applicable to at least one of the first and second resistors 33 and 34.

For example, the regulating resistor network 16A or 16B is applicable to the first resistor 33. In such a case, if at least one of the first through fourth thin-film resistors 16a through 16d is cut off, then the resistance value $R_P$ of the first resistor 33 increases, thus decreasing the gain A of the operational amplifier 30.

As an alternative, the regulating resistor network 16A or 16B is also applicable to the second resistor 34. In such a case, if at least one of the first through fourth thin-film resistors 16a through 16d is cut off, then the resistance value $R_Q$ of the second resistor 34 increases, thus increasing the gain A of the operational amplifier 30.

Accordingly, the gain of the operational amplifier 30 for the inverting amplifier shown in FIG. 9 may be measured and at least one of the first through fourth thin-film resistors 16a through 16d of the regulating resistor network 16A or 16B for the first or second resistor 33 or 34 may be cut off based on the gain measured. In this manner, the gain of the amplifier can be optimized for an electronic circuit.

What is claimed is:

1. A method for fabricating a semiconductor device, comprising the steps of:
    a) forming a semiconductor circuit and a regulating resistor network on a semiconductor substrate, the resistor network including a plurality of resistors and regulating a voltage or a current supplied to the semiconductor circuit, each of said plurality of resistors being cuttable by being irradiated with light; and
    b) cutting at least one of said plurality of resistors off by irradiating the resistor with the light, thereby adjusting a resistance value of the regulating resistor network,
    wherein, each of said plurality of resistors is connected in parallel to each other and has a different resistance value due to mutually different length.

2. The method of claim 1, wherein the resistor network further comprises a fixed resistor, which is connected in parallel to the resistors and is not cuttable by being irradiated with the light.

3. The method of claim 1, wherein the light for cutting at least one of the resistors off is pulsed YAG laser radiation.

4. The method of claim 1, wherein the step b) comprises irradiating the regulating resistor network with the light through a mask, the mask including a plurality of openings at respective locations corresponding to the resistors, some of the openings associated with the at least one resistor to be cut off being opened but the other openings associated with the remaining resistors not to be cut being closed during the irradiation of the light.

5. The method of claim 1, wherein the step b) comprises measuring an operation characteristic value of the semiconductor circuit and cutting at least one of the resistors off so as to reduce a difference between the characteristic value measured and a target characteristic value preset for the semiconductor circuit.

6. The method of claim 1, where in the semiconductor circuit is a field effect transistor, and wherein the regulating resistor network is connected to the gate terminal of the field effect transistor, and wherein the step b) comprises regulating a bias voltage applied to the gate terminal of the field effect transistor.

* * * * *